United States Patent
Plagne et al.

(10) Patent No.: US 9,726,695 B2
(45) Date of Patent: Aug. 8, 2017

(54) CURRENT TRANSDUCER WITH INTEGRATED PRIMARY CONDUCTOR BAR

(71) Applicant: LEM Intellectual Property SA, Fribourg (CH)

(72) Inventors: Gauthier Plagne, Saint-Julien-en-Genevois (FR); Christophe Delmaere, Yvoire (FR)

(73) Assignee: LEM Intellectual Property SA, Fribourg (CH)

( * ) Notice: Subject to any disclaimer, the term of this patent is extended or adjusted under 35 U.S.C. 154(b) by 0 days.

(21) Appl. No.: 15/134,163

(22) Filed: Apr. 20, 2016

(65) Prior Publication Data

US 2016/0313373 A1 Oct. 27, 2016

(30) Foreign Application Priority Data

Apr. 21, 2015 (EP) .................................... 15164547

(51) Int. Cl.
*G01R 15/18* (2006.01)
*G01R 15/20* (2006.01)
*G01R 33/00* (2006.01)

(52) U.S. Cl.
CPC ......... *G01R 15/183* (2013.01); *G01R 15/207* (2013.01); *G01R 33/0011* (2013.01)

(58) Field of Classification Search
CPC . G01R 1/20; G01R 1/22; G01R 1/203; G01R 15/146; G01R 19/0007;
(Continued)

(56) References Cited

U.S. PATENT DOCUMENTS

2004/0080308 A1 4/2004 Goto
2007/0279053 A1 12/2007 Taylor et al.
(Continued)

FOREIGN PATENT DOCUMENTS

EP 0867725 A1 9/1998
WO WO2013/153699 A1 10/2013

OTHER PUBLICATIONS

Extended European Search Report issued by the European Patent Office, dated Oct. 2, 2015, for European Patent Application No. EP15164547.0; 5 pages.

*Primary Examiner* — Tung X Nguyen
(74) *Attorney, Agent, or Firm* — Faegre Baker Daniels LLP

(57) ABSTRACT

An electrical current transducer is disclosed including a primary conductor bar for carrying the current to be measured, a magnetic core comprising a magnetic circuit gap, a magnetic field sensor having a circuit board and a magnetic field detector positioned in the magnetic circuit gap, and an insulating housing surrounding the magnetic core and magnetic field sensor. The primary conductor bar has connection terminal ends extending outside of the housing configured for connection to an external primary conductor. The primary conductor bar further includes a core passage section having a reduced width in comparison to the connection terminal ends extending outside of the housing thereby providing an indent within which the magnetic field detector is positioned such that a central passage of the magnetic core has a width less than the width of the primary conductor connection ends. The insulating housing comprises a main housing portion overmolded around the core passage section of the primary conductor bar, the main housing portion comprising a magnetic field sensor receiving slot configured to allow slideable insertion of the magnetic field sensor into (Continued)

the primary conductor bar indent for positioning in the magnetic circuit gap.

15 Claims, 3 Drawing Sheets

(58) Field of Classification Search
CPC ...... G01R 15/20; G01R 21/08; G01R 33/075; G01R 11/06; G01R 19/20; G01R 33/0283; G05G 2009/04755; G06G 7/162
See application file for complete search history.

(56) References Cited

U.S. PATENT DOCUMENTS

| | | | |
|---|---|---|---|
| 2013/0015843 A1* | 1/2013 | Doogue | G01R 15/148 324/202 |
| 2013/0187633 A1 | 7/2013 | Yasui et al. | |
| 2014/0091788 A1 | 4/2014 | Misaki et al. | |
| 2016/0187387 A1* | 6/2016 | Mouchet | H01F 38/30 324/126 |

* cited by examiner

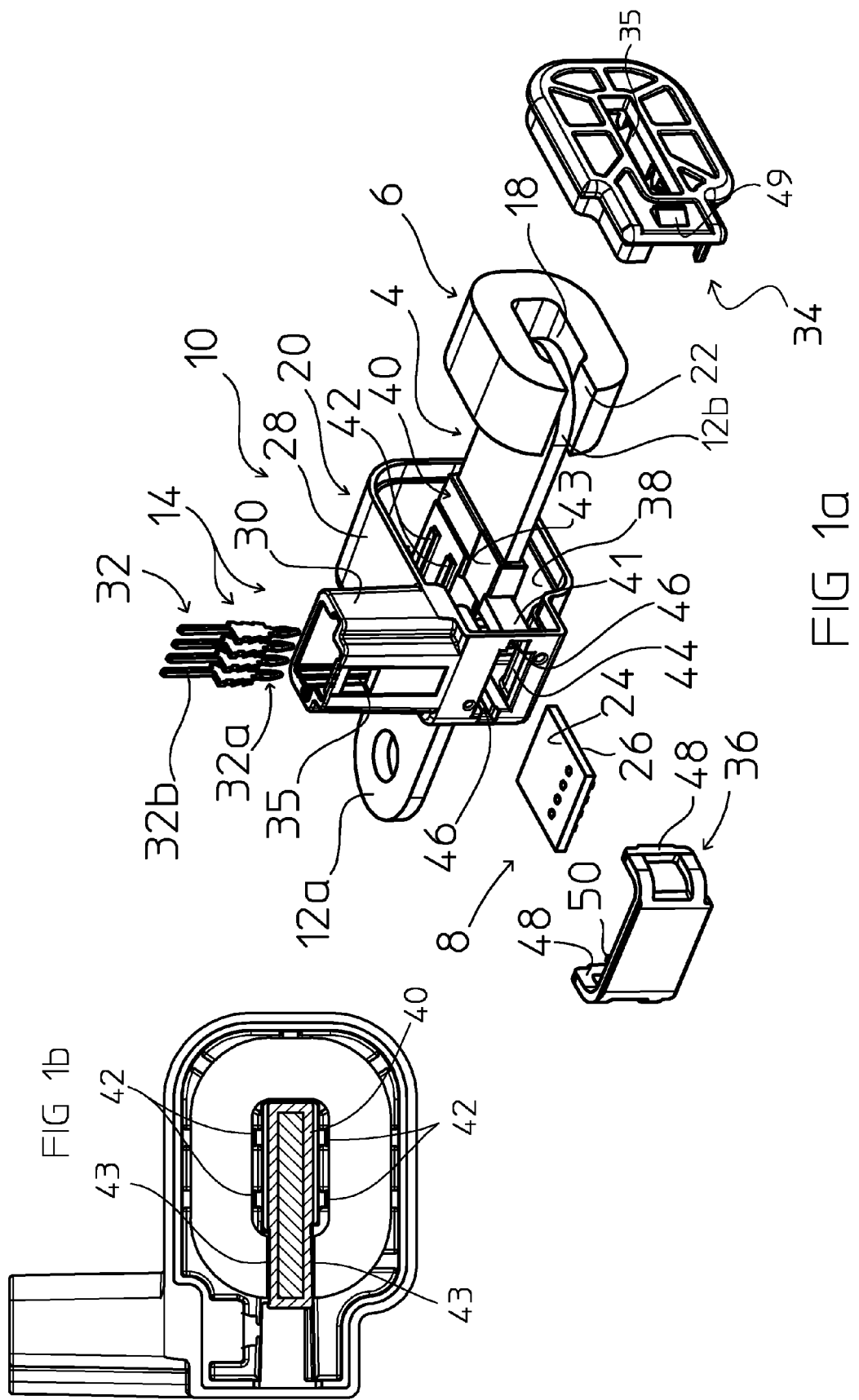

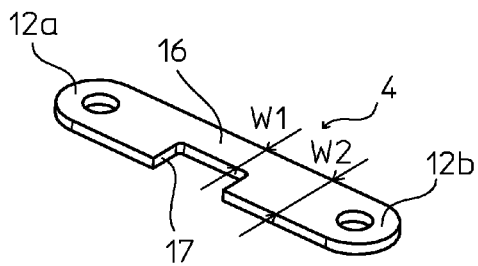
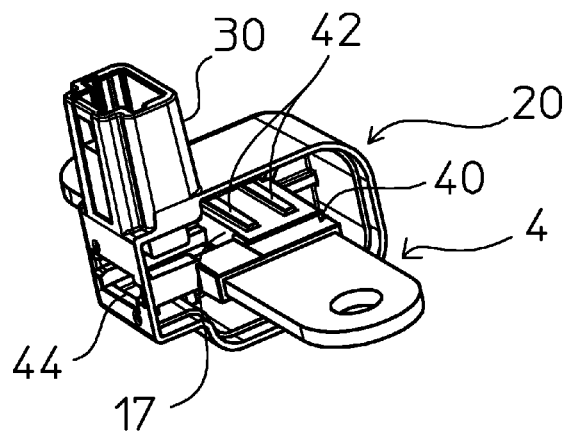
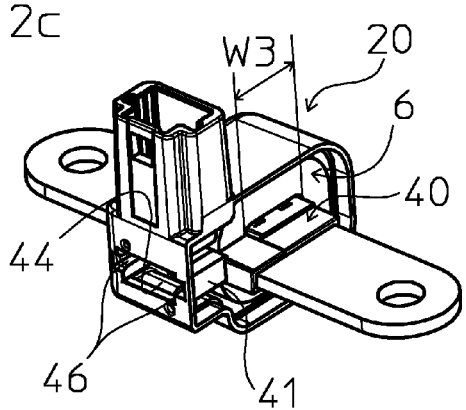
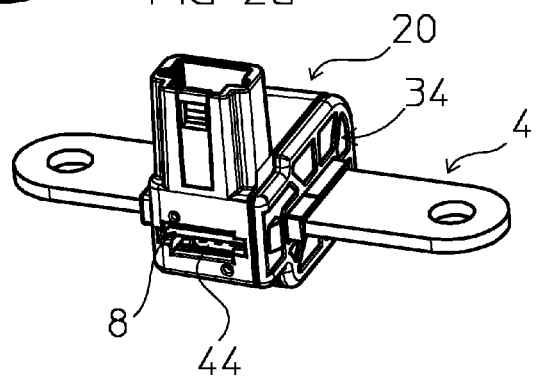

ized to miniaturize and/or reduce the weight of the devices in which the components are mounted.
CURRENT TRANSDUCER WITH INTEGRATED PRIMARY CONDUCTOR BAR This application claims priority from European Patent Application 15164547.0 filed Apr. 21, 2015, the subject matter of which is incorporated herein by reference.

BACKGROUND

The present invention relates to an electric current transducer comprising a magnetic core and a magnetic field detector in an air-gap of the magnetic core, for measuring an electrical current flowing in a primary conductor bar extending through a central passage of the magnetic core.

Electrical current transducer modules for current sensing applications typically comprise a magnetic core made of a high permeability magnetic material, surrounding a central aperture through which passes a primary conductor carrying the current to be measured. The magnetic core may typically have a generally rectangular or circular shape and be provided with an air-gap in which a magnetic field detector, such as a Hall effect sensor in the form of an ASIC, is positioned. The magnetic flux generated by the electrical current flowing in the primary conductor is concentrated by the magnetic core and passes through the air-gap. The magnetic field in the air-gap is representative of the primary current.

Electrical current sensors are used in a large variety of applications for monitoring or controlling electrical devices and system and in many applications there is an important advantage in reducing the manufacturing cost of such components and also the costs of implementing and using the components in an electrical circuit. There is often also an important advantage in providing compact components in order to miniaturize and/or reduce the weight of the devices in which the components are mounted.

An object of the invention is to provide an electrical current transducer that is compact and economical to produce, the transducer for measuring a current flowing in a primary conductor.

It is advantageous to provide an electrical current transducer that is robust and stable.

It is advantageous to provide an electrical current transducer that is lightweight.

It is advantageous to provide an electrical current transducer that is accurate, easy to implement and economical to use.

SUMMARY

Disclosed herein is an electrical current transducer including a primary conductor bar for carrying the current to be measured, a magnetic core comprising a magnetic circuit gap, a magnetic field sensor comprising a circuit board and a magnetic field detector mounted on the circuit board and positioned in the magnetic circuit gap, and an insulating housing surrounding the magnetic core and magnetic field sensor. The primary conductor bar comprises connection terminal ends extending outside of the housing configured for connection to an external primary conductor. The primary conductor bar comprises a core passage section having a reduced width in comparison to the connection terminal ends extending outside of the housing thereby providing an indent within which the magnetic field detector is positioned. The insulating housing comprises a main housing portion overmolded around the core passage section of the primary conductor bar, the main housing portion comprising a magnetic field sensor receiving slot configured to allow slidable insertion of the magnetic field sensor into the primary conductor bar indent for positioning in the magnetic circuit gap.

The main housing portion may advantageously comprise a central overmold portion comprising positioning ribs configured to guide and position the magnetic core around the primary conductor bar.

The central overmold portion may advantageously comprise extensions connecting the central overmold portion to an entry end of the magnetic field sensor receiving slot. The extensions provide rails to slidably guide and position the magnetic field sensor into the primary conductor indent and magnetic core circuit gap.

The central overmold portion may advantageously comprise a thin wall region configured for sliding through the magnetic circuit gap during assembly, the thin wall region having a wall thickness in a range between 0.3 mm and 1.2 mm, preferably in a range between 0.3 and 0.8 mm. This allows the central overmold portion to surround the primary conductor bar yet reduce the magnetic circuit gap in the magnetic core, since during assembly the magnetic circuit gap slides over the thin wall region.

The main housing portion may include an outer casing and be integrally formed with the connector shroud as a single piece injection overmolded part.

The magnetic core is insertable in the main housing portion through a side of the housing in an insertion direction orthogonal to the slidable insertion direction of the magnetic field sensor in the indent.

A cover portion of the housing may be mounted against the side of the main housing portion to close the magnetic core therein. In an embodiment, the cover portion comprises an orifice for the primary conductor bar, the cover portion being mountable against the side of the housing in an insertion direction orthogonal to the slidable insertion direction of the magnetic field sensor in the indent.

The housing may further comprise a cap portion for closing the magnetic field sensor in the magnetic field sensor receiving slot.

In an advantageous embodiment, the current transducer further comprises a connector configured for pluggable connection to an external connector, the connector comprising terminals directly mounted and connected to the circuit board of the magnetic field sensor.

In an advantageous embodiment, the magnetic field detector is in a form of an ASIC and comprises a Hall effect cell.

In an advantageous embodiment, the current transducer is an open-loop current transducer.

In an advantageous embodiment, at least one of the connection ends of the primary conductor bar is in a form of a connection terminal for a clamping or bolt connection to a primary conductor.

The magnetic core may be made of a wound tape core made for instance from a strip of Si—Fe material, provided with a machined gapped, or in a variant may be formed of a single piece ferrite part.

Further objects and advantageous features of the invention will be apparent from the claims, from the detailed description, and annexed drawings, in which:

BRIEF DESCRIPTION OF THE DRAWINGS

FIG. 1a is an exploded perspective view of an electrical current transducer according to an embodiment of the invention;

FIG. 1b is a cross-sectional view of an electrical current transducer according to an embodiment of the invention;

FIGS. 2a to 2h are perspective views illustrating assembly of an electrical current transducer according to an embodiment of the invention.

DETAILED DESCRIPTION

Figure 2E:
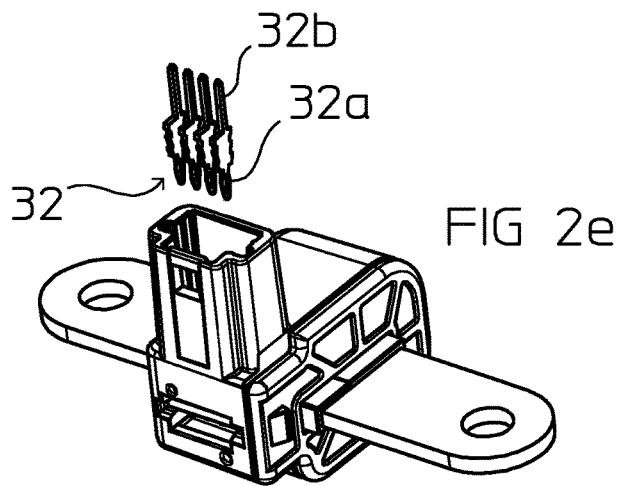
Figure 2F:
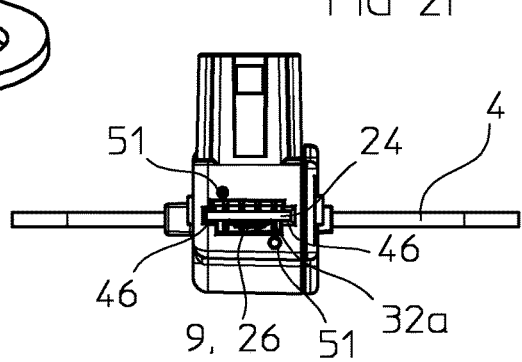
Figure 2G:
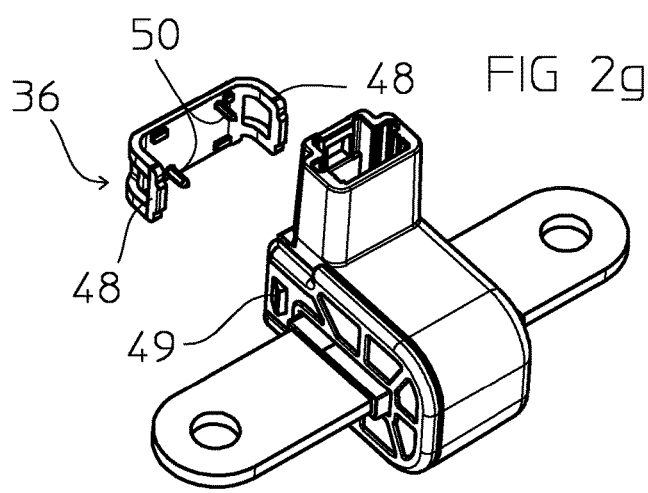
Figure 2H:
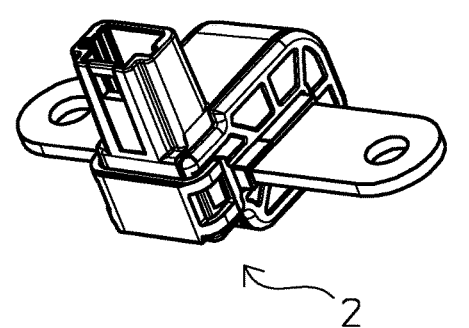

Referring to the figures, an exemplary embodiment of an electric current transducer 2 includes a magnetic core 6 comprising a magnetic circuit gap 22, a magnetic field sensor 8 inserted at least partially in the magnetic circuit gap 22, a dielectric housing 10 and a primary conductor bar 4 extending through a central passage 18 of the magnetic core. The primary conductor bar 4 is integrated in the transducer and comprises terminals 12a, 12b at each end for connection to an external primary conductor (not shown) supplying the current to be measured.

The terminals 12a, 12b may comprise connection ends of various configurations according to the intended applications, for instance as illustrated for bolted or clamped connection to an external conductor (not shown). Crimp or plugging or other types of connections may also be provided.

In an embodiment, the magnetic field sensor 8 may advantageously comprise a circuit board 24 and a magnetic field detector 9 that may for example be provided in the form of an ASIC (Application Specific Integrated Circuit) 26 mounted on the circuit board. In an embodiment, the magnetic field detector 9 may comprise a Hall effect sensor, per se well known in the art, or may be based on other magnetic field sensing technologies such as magneto-resistive or fluxgate sensors that are also well known in the art. Hall cell magnetic field detectors are widely used in open-loop current sensing applications because of their low cost and good measurement performance in open-loop applications.

The circuit board 24 comprises circuit traces and various circuit components that may perform some processing of the measurement signal and power supply between the magnetic field detector and electrical terminals 32 connected to the external circuitry (not shown) for power supply and measurement signal transmission. Each terminal comprises a circuit board connection end 32a, for instance in a form of a press-fit pin terminal inserted through a plated through-hole in the circuit board 24, or in the form of other circuit board connection means that are per se well known the art. The terminals 32 further comprise external connection ends 32b, for instance in a form of pin or tab terminals, positioned within and surrounded by a connector shroud 30 configured for pluggable coupling to a complementary external connector that's supplies power and transmits the measurement signal to external circuitry (shown).

The connector shroud 30 may comprise various fixing means such as a latching protrusion or orifice 35 for locking the complementary connector thereto. The current measurement signal is thus transmitted from the transducer, and power supplied to the transducer, by means of an external pluggable connector.

Magnetic flux generated by the primary conductor circulates in the magnetic core 6 and is picked up by the magnetic field detector 9 positioned in the magnetic circuit gap 22. The magnetic core 6 is preferably made of a single piece ferrite material, per se well known in the art but may also be made of other materials such as stacked laminated sheets of magnetic material that are also per se well known in the art.

The primary conductor bar 4 comprises a core passage section 16 extending between the connection terminals 12a, 12b. The core passage section 16 has a width W1 that is smaller than the width W2 of the primary conductor bar 4 outside of the central passage 18 of the core 6. The width of the material of the primary conductor bar 4 at the connection ends 12a, 12b is generally wider than the core passage section 16. The core passage section 16 thus provides at least one indent 17 allowing the magnetic core 6 to surround the core passage section 16 with the gap 22 of the magnetic core being positioned within the indent 17 of the primary conductor bar 4. This allows the primary conductor bar to have a relatively large cross section respectively connection surface area for adequate connection to the primary conductor in view of the current to be carried, while allowing the transducer to have a compact size and improved performance.

The housing 10 comprises a core receiving section 28 and a connector shroud 30. The core receiving section 28 houses the magnetic core 6 and magnetic field sensor 8. The connector shroud 30 is configured for connection to an external connector, in particular for pluggable connection to the external connector. The core receiving section 28 comprises a main housing portion 20 that is overmolded directly on the primary conductor bar 4. In an advantageous embodiment, the main housing portion and connector shroud may be integrally formed in an injection overmolding process directly on the primary conductor bar.

The main housing portion 20 comprises a central overmold portion 40 that is in direct contact with the primary conductor bar and overlays and completely surrounds the core passage section 16 of the primary conductor bar. The central overmold portion 40 comprises extensions 41 that extend in a direction aligned with the sides of the indent 17 and configured to provide guide rails 46 that are designed to guide and position the magnetic field sensor 8 such that the magnetic field detector 9 is positioned within the indent 17 and in the magnetic circuit gap 22 of the magnetic core. The guide rails 46 may be in a form of slots that engage lateral edges of the circuit board 24, allowing the circuit board to be inserted into the slot until the magnetic field detector is positioned within the indent. The overmolded main housing portion provides a secure and robust positioning of the magnetic core and magnetic field sensor within the housing in a compact and cost effective manner.

The central overmold portion 40 advantageously comprises ribs 42 extending in a direction of insertion of the magnetic core 6 in the main housing portion 20, the ribs 42 guiding and tightly centering the magnetic core around the primary conductor bar 4. The ribs 42 engage in a tight fit the inner surface of the magnetic core surrounding the central passage 18.

The central overmold portion 40 comprises a thin wall region 43 with reduced wall thickness to allow the mounting of the magnetic core whose airgap faces need to slide along this region. In order to obtain an advantageously small airgap, the thickness of the overmold is reduced here to a nominal value in a range between 0.3 mm and 1.2 mm, preferably in a range between 0.3 and 0.8 mm, depending on the materials used.

After assembly of the magnetic core 6 in a direction orthogonal to insertion of the magnetic field sensor, through a side of the main housing portion 20, a cover portion 34 comprising an orifice 35 may be inserted over the connection end 12b of the primary conductor bar until the cover portion engages the open side of the main housing portion. The cover portion and main housing portion may be locked together by clipping means, by bonding, or by welding, for instance ultrasonic welding. Depending on the application and the variant, a dielectric potting material may be filled within the outer casing 38 of the main housing before the cover portion is closed against the main housing portion.

After assembly of the magnetic field sensor 8 in the magnetic field sensor receiving slot 44, connector terminals 32 may be inserted into the connector shroud 30 until connection with the circuit board 24, for instance by means of a press-fit pin terminal portions 32a inserted in plated through-holes of the circuit board.

The housing 10 may further comprise a cap portion 36 configured to close the open entry and of the slot 44. In the illustrated exemplary embodiment, the cap portion 36 comprises elastic clip arms 48 that engaged complementary latching elements 49 on opposite sides of the housing main portion and cover portion. The cap portion may be provided with pins 50 that engage in complementary holes 51 in the housing to orient and/or lock the cap portion to the main housing portion. The cap portion may alternatively or in addition to the latching means 48, 49 be bonded, or welded to the other housing portions.

The invention claimed is:

1. Electrical current transducer including a primary conductor bar for carrying the current to be measured, a magnetic core comprising a magnetic circuit gap, a magnetic field sensor comprising a circuit board and a magnetic field detector positioned in the magnetic circuit gap, and an insulating housing surrounding the magnetic core and magnetic field sensor, the primary conductor bar comprising connection terminal ends extending outside of the housing configured for connection to an external primary conductor, the primary conductor bar further comprising a core passage section having a reduced width (W1) in comparison to the connection terminal ends extending outside of the housing thereby providing an indent within which the magnetic field detector is positioned such that a central passage of the magnetic core has a width (W3) less than the width (W2) of the primary conductor connection ends, wherein the insulating housing comprises a main housing portion overmolded around the core passage section of the primary conductor bar, the main housing portion comprising a magnetic field sensor receiving slot configured to allow slidable insertion of the magnetic field sensor into the primary conductor bar indent for positioning in the magnetic circuit gap.

2. Current transducer according to claim 1, wherein the main housing portion comprises a central overmold portion comprising positioning ribs configured to guide and position the magnetic core around the primary conductor bar.

3. Current transducer according to claim 2, wherein the central overmold portion comprises extensions connecting the central overmold portion to an entry end of the magnetic field sensor receiving slot and providing rails to slidably guide and position the magnetic field sensor into the indent.

4. Current transducer according to claim 2, wherein the central overmold portion comprises a thin wall region configured for sliding through the magnetic circuit gap during assembly, the thin wall region having a wall thickness in a range between 0.3 mm and 1.2 mm.

5. Current transducer according to claim 4, wherein the thin wall region has a wall thickness in a range between 0.3 and 0.8 mm.

6. Current transducer according to claim 1, wherein the main housing portion includes an outer casing and is integrally formed with a connector shroud as a single piece injection overmolded part.

7. Current transducer according to claim 1, wherein the magnetic core is insertable in the main housing portion through a side of the housing in an insertion direction orthogonal to the slidable insertion direction of the magnetic field sensor in the indent.

8. Current transducer according to claim 1, wherein the housing comprises a cover portion mounted against the side of the main housing portion to close the magnetic core therein, the cover portion comprising an orifice for the primary conductor bar and being mountable against the side of the housing in an insertion direction orthogonal to the slidable insertion direction of the magnetic field sensor in the indent.

9. Current transducer according to claim 1, wherein the housing further comprises a cap portion for closing the magnetic field sensor in the magnetic field sensor receiving slot.

10. Current transducer according to claim 1, further comprising a connector configured for pluggable connection to an external connector, the connector comprising a connector shroud and terminals directly mounted and connected to a circuit board of the magnetic field sensor.

11. Current transducer according to claim 10, wherein the magnetic field detector is in a form of an ASIC and comprises a Hall Effect cell.

12. Current transducer according to claim 1, wherein the current transducer is an open-loop current transducer.

13. Current transducer according to claim 1, wherein at least one of the connection ends of the primary conductor bar is in a form of a connection terminal for a clamping or bolt connection to a primary conductor.

14. Current transducer according to claim 1, wherein the magnetic core is formed of a single piece integrally formed ferrite part.

15. Current transducer according to claim 1, wherein the magnetic core is formed of a wound tape core with a machined gap.

* * * * *